United States Patent [19]
Oh

[11] Patent Number: 5,493,234
[45] Date of Patent: Feb. 20, 1996

[54] VOLTAGE DOWN CONVERTER FOR SEMICONDUCTOR MEMORY DEVICE

[75] Inventor: Young N. Oh, Kyoungki-do, Rep. of Korea

[73] Assignee: Hyundai Electronics Industries Co. Ltd., Kyoungki-do, Rep. of Korea

[21] Appl. No.: 348,992

[22] Filed: Nov. 29, 1994

[30] Foreign Application Priority Data

Dec. 1, 1993 [KR] Rep. of Korea ................ 93-26086

[51] Int. Cl.$^6$ .................................................. H03K 17/16
[52] U.S. Cl. .................. 326/33; 326/81; 327/541; 365/189.09; 365/226
[58] Field of Search .................... 365/189.09, 195, 365/226, 229; 326/33, 34, 81; 327/538, 541, 544

[56] References Cited

U.S. PATENT DOCUMENTS

| | | | |
|---|---|---|---|
| 5,046,052 | 9/1991 | Miyaji et al. | 365/229 X |
| 5,063,304 | 11/1991 | Iyengar | 365/189.09 X |
| 5,280,455 | 1/1994 | Kanaishi | 365/229 |
| 5,416,747 | 5/1995 | Ohira | 365/189.09 X |
| 5,426,616 | 6/1995 | Kajigaya et al. | 365/189.09 X |
| 5,434,498 | 7/1995 | Cordoba et al. | 327/541 X |
| 5,436,586 | 7/1995 | Miyamoto | 365/226 X |

Primary Examiner—David R. Hudspeth
Attorney, Agent, or Firm—Nath & Associates; Gary M. Nath

[57] ABSTRACT

A voltage down converter for a semiconductor memory device which includes memory blocks for storing a plurality of binary information, memory peripheral circuits for controlling the memory blocks and a reference voltage generator for dividing a supply voltage from an external power supply circuit to drive the memory blocks and the memory peripheral circuits. The voltage down converter comprises: a downed voltage driver for downing a reference voltage from the reference voltage generator into different levels according to standby and active modes and supplying the downed voltage to the memory blocks and the memory peripheral circuits; an overshoot detector for detecting whether a level of the downed voltage from the downed voltage driver exceeds a desired voltage level; and a voltage regulator for regulating the level of the downed voltage from the downed voltage driver being supplied to the memory blocks and the memory peripheral circuits in response to an output signal from the overshoot detector to remove an overshoot component generated in the downed voltage from the downed voltage driver. The level of the downed voltage is maintained constant and stable regardless of an overload. Therefore, the memory blocks and memory peripheral circuits can be protected from an overload and the reliability of the memory device can be enhanced.

2 Claims, 5 Drawing Sheets

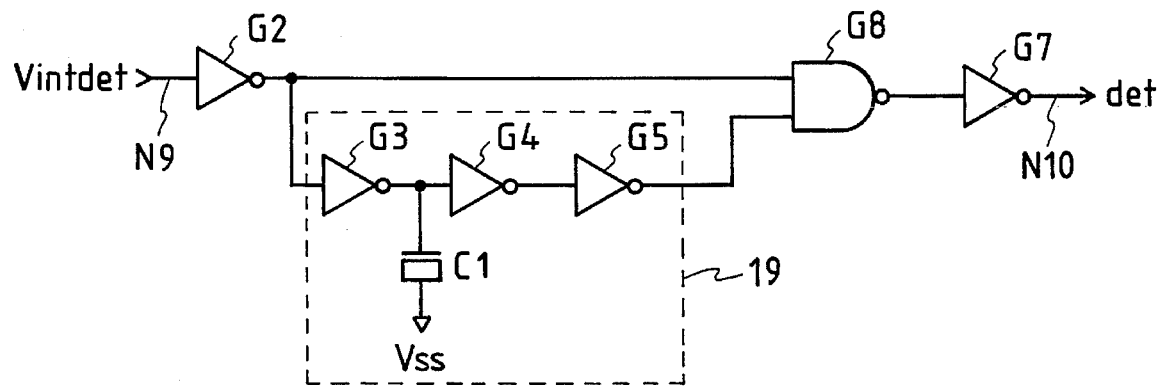
Fig. 4
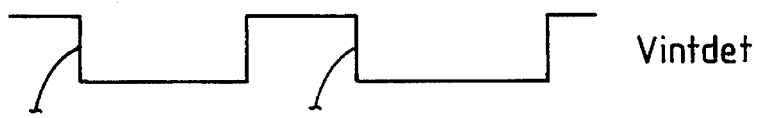
Fig. 5A — Vintdet
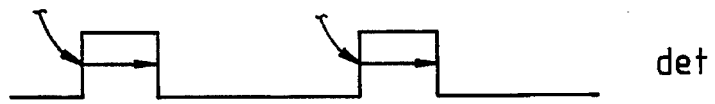
Fig. 5B — det

VOLTAGE DOWN CONVERTER FOR SEMICONDUCTOR MEMORY DEVICE

BACKGROUND OF THE INVENTION

1. Field of the Invention

The present invention relates in general to a voltage down converter provided in a semiconductor memory device to supply a drive voltage to memory blocks and memory peripheral circuits, and more particularly to a voltage down converter for a semiconductor memory device which is capable of generating a drive voltage having a level which is constant and stable regardless of an overload of the memory blocks and memory peripheral circuits.

2. Description of the Prior Art

Generally, a semiconductor memory device comprises memory blocks for storing a plurality of binary information and memory peripheral circuits for driving the memory blocks. The memory blocks and memory peripheral circuits will hereinafter be referred to as an "internal circuit". The semiconductor memory device further comprises a voltage down converter for downing a supply voltage from an external power supply circuit to a desired level and supplying the downed voltage to the internal circuit, to ensure a low-power operation and enhance the reliability of transistors. However, such a conventional voltage down converter for the semiconductor memory device has a disadvantage in that it generates an instable voltage including an alternating current (AC) component, such as an overshoot voltage, because of an overload of the internal circuit. Such a problem with the conventional voltage down converter for the semiconductor memory device will hereinafter be described in detail with reference to FIG. 1.

Referring to FIG. 1, there is shown a circuit diagram of the conventional voltage down converter for the semiconductor memory device. As shown in this drawing, the conventional voltage down converter comprises a downed voltage driver 11. The downed voltage driver 11 includes standby and active drivers 12 and 13 for commonly inputting a reference voltage VR from a reference voltage generator (not shown) through a node N1. The standby driver 12 is operated in response to an external standby control signal SCS applied through a node N2 thereto to supply a first drive voltage of a desired level to an internal circuit 14 connected to a node N4. To this end, the standby driver 12 functions as a voltage follower by including a differential amplifier for differential-amplifying the reference voltage VR at the node N1 and the downed voltage at the node N4 and an output part for transferring an output of the differential amplifier to the node N4. Namely, the first drive voltage from the standby driver 12 is varied at a desired ratio as the reference voltage VR is varied. The differential amplifier includes five MOS transistors Q1–Q5 being operated in response to the standby control signal SCS. The output part includes two MOS transistors Q6 and Q7 being operated in response to the standby control signal SCS.

The active driver 13 is operated in response to an external active control signal ACS applied through a node N3 thereto to supply a second drive voltage of a desired level to the internal circuit 14 connected to the node N4. To this end, the active driver 13 functions as a voltage follower by including a differential amplifier for differential-amplifying the reference voltage VR at the node N1 and the downed voltage at the node N4 and an output MOS transistor Q14 for buffering an output of the differential amplifier and transferring the buffered output to the node N4. Namely, the second drive voltage from the active driver 13 is varied at a desired ratio as the reference voltage VR is varied, and the level thereof is higher than that of the first drive voltage. The differential amplifier includes six MOS transistors Q8–Q13 being operated in response to the active control signal ACS.

In the active driver 13, however, the drive voltage at the node N4 includes an AC noise component such as an overshoot when the internal circuit 14 becomes overloaded in an active mode. In detail, in the case where currents in the internal circuit 14 rises rapidly, the MOS transistor Q14 is strongly turned on by the drive voltage Vint at the node N4 downed abruptly to $V_{oL}$ (nearly ground voltage). As being turned on, the MOS transistor Q14 increases an amount of current flowing from a first supply voltage source Vcc to the node N4 via its source and drain, so as to compensate for the downed drive voltage Vint at the node N4. However, although compensating for the downed drive voltage Vint at the node N4 up to a level of the reference voltage VR, the MOS transistor Q14 largely maintains the amount of current being supplied to the node N4, thereby causing the overshoot to be generated in the drive voltage Vint.

SUMMARY OF THE INVENTION

Therefore, the present invention has been made in view of the above problem, and it is an object of the present invention to provide a voltage down converter for a semiconductor memory device which is capable of generating a downed voltage having a level which is constant and stable regardless of an overload of memory blocks and memory peripheral circuits.

In accordance with the present invention, in a semiconductor memory device having memory blocks for storing a plurality of binary information, memory peripheral circuits for controlling said memory blocks and reference voltage generation means for dividing a supply voltage from an external power supply circuit to drive said memory blocks and said memory peripheral circuits, there is provided a voltage down converter comprising downed voltage driving means for downing a reference voltage from said reference voltage generation means into different levels according to standby and active modes and supplying the downed voltage to said memory blocks and said memory peripheral circuits; overshoot detection means for detecting whether a level of the downed voltage from said downed voltage driving means exceeds a desired voltage level; and voltage regulation means for regulating the level of the downed voltage from said downed voltage driving means being supplied to said memory blocks and said memory peripheral circuits in response to an output signal from said overshoot detection means to remove an overshoot component generated in the downed voltage from said downed voltage driving means.

BRIEF DESCRIPTION OF THE DRAWINGS

The above and other objects, features and advantages of the present invention will be more clearly understood from the following detailed description taken in conjunction with the accompanying drawings, in which:

FIG. 4 is a detailed circuit diagram of an embodiment of a self-delay pulse generator in FIG. 2;

FIGS. 5A and 5B are waveform diagrams of input and output signals in FIG. 4;

DETAILED DESCRIPTION OF THE PREFERRED EMBODIMENTS

Figure 1:
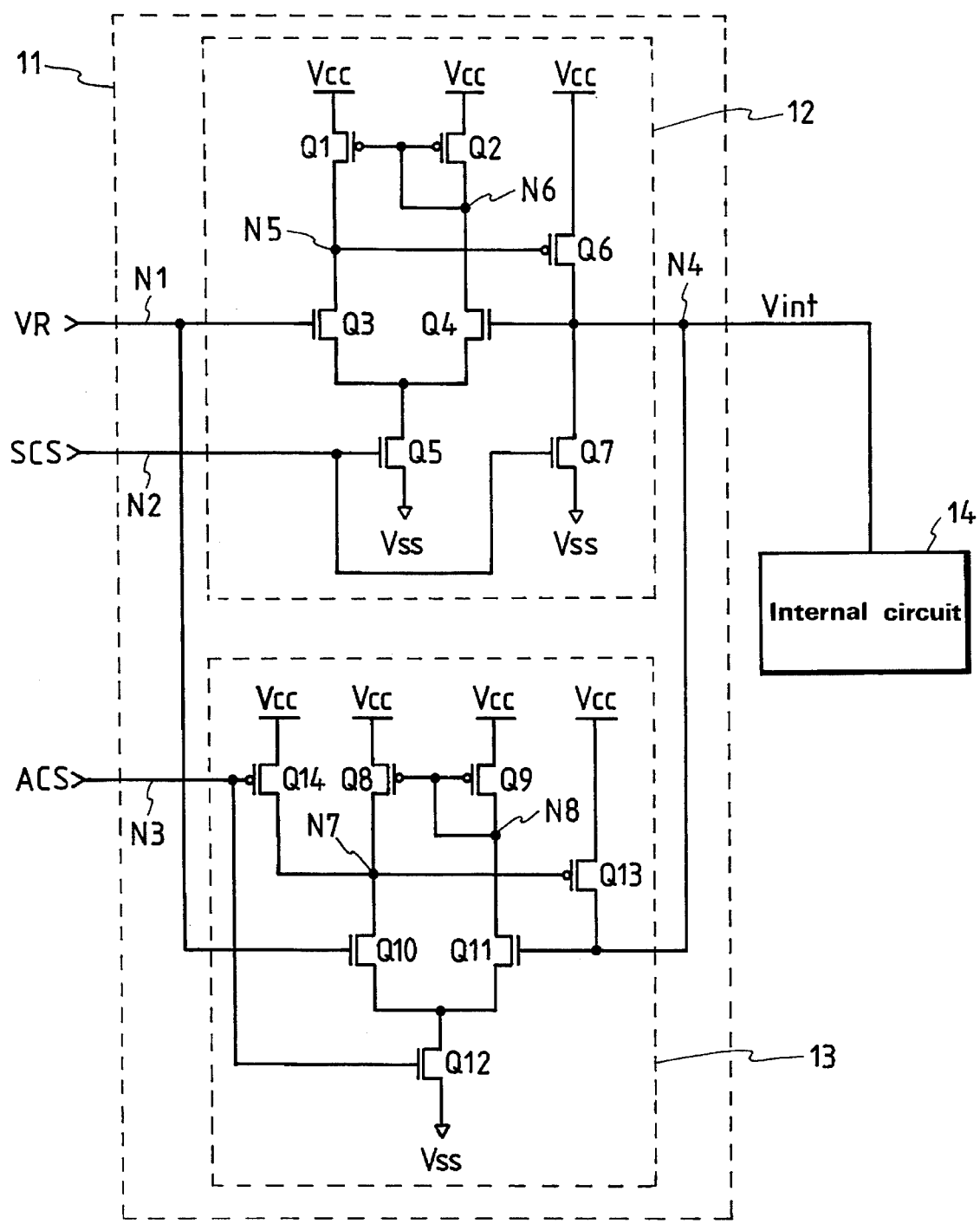
FIG. 1 is a circuit diagram of a conventional voltage down converter for a semiconductor memory device.
Figure 2:
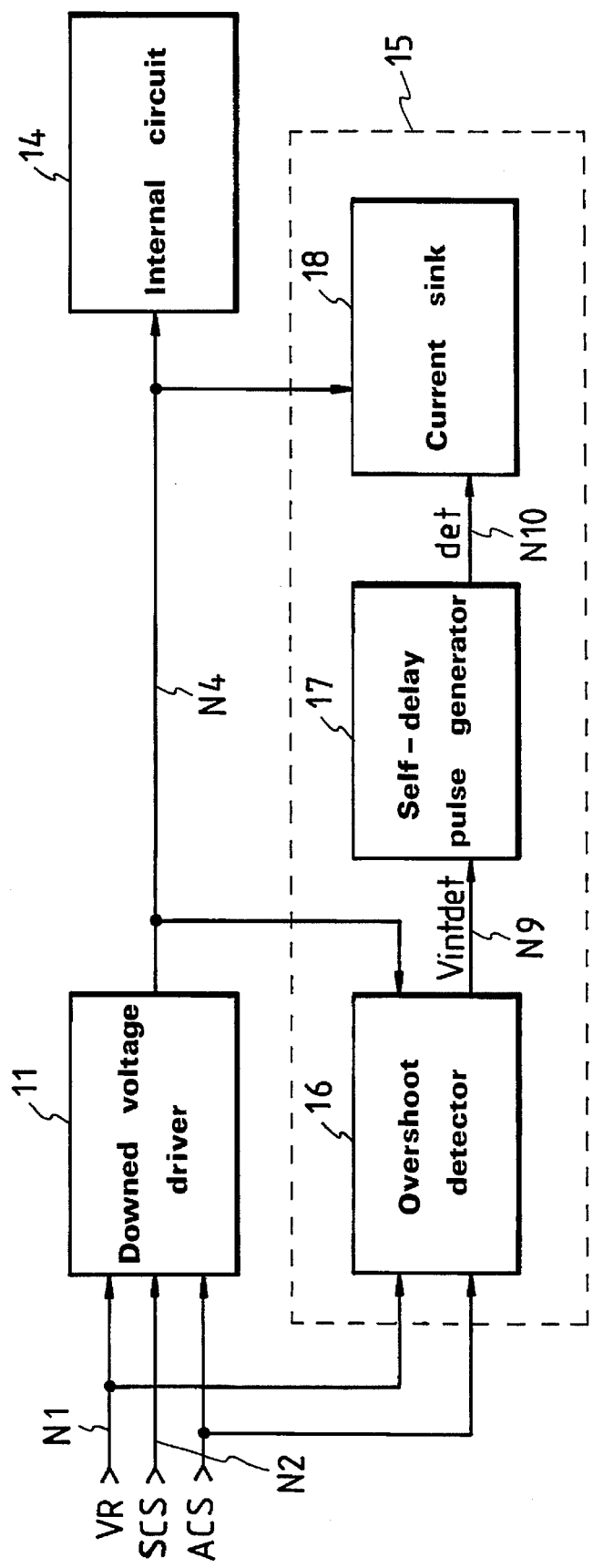
FIG. 2 is a block diagram of a voltage down converter for a semiconductor memory device in accordance with the present invention.

Referring to FIG. 2, there is shown a block diagram of a voltage down converter for a semiconductor memory device in accordance with the present invention. Some of parts in this drawing are the same as those in FIG. 1. Therefore, like reference numerals designate like parts. As shown in this drawing, the voltage down converter comprises the downed voltage driver 11 and a voltage compensator 15 for commonly inputting the reference voltage VR from the reference voltage generator (not shown) through the node N1. The downed voltage driver 11 is operated in two modes, a standby mode and an active mode, in response to the external standby and active control signals SCS and ACS applied through the nodes N2 and N3 thereto, respectively. Upon receiving the standby control signal SCS, the downed voltage driver 11 downs the reference voltage VR to a first desired level and the downed voltage Vint to the internal circuit 14 through the node N4. On the contrary, upon receiving the active control signal ACS, the downed voltage driver 11 downs the reference voltage VR to a second desired level and the downed voltage Vint to the internal circuit 14 through the node N4. The first desired level is lower than the second desired level. The internal circuit 14 includes the memory blocks and the memory peripheral circuits in the semiconductor memory device as stated previously.

The voltage compensator 15 includes an overshoot detector 16 for inputting the active control signal ACS from the node N3, a self-delay pulse generator 17 for generating a pulse signal of a desired pulse width in response to an output signal from the overshoot detector 16, and a current sink 18 being operated in response to the pulse signal from the self-delay pulse generator 17. The overshoot detector 16 is operated for a time period that the active control signal ACS is applied thereto. As being operated, the overshoot detector 16 differential-amplifies the reference voltage VR at the node N1 and the downed voltage Vint at the node N4 to generate an overshoot detection pulse signal Vintdet. The overshoot detection pulse signal Vintdet from the overshoot detector 16 has a pulse width corresponding to a time period that the level of the downed voltage Vint remains higher than that of the reference voltage VR. The self-delay pulse generator 17 generates the pulse signal of the desired pulse width beginning with a falling edge of the overshoot detection pulse signal Vintdet from the overshoot detector 16. The current sink 18 is operated for a time period of the pulse width of the pulse signal from the self-delay pulse generator 17 to mute a part of the downed voltage Vint at the node N4. The muting operation of the current sink 18 results in a removal of an overshoot component generated in the downed voltage Vint at the node N4.

Figure 3:
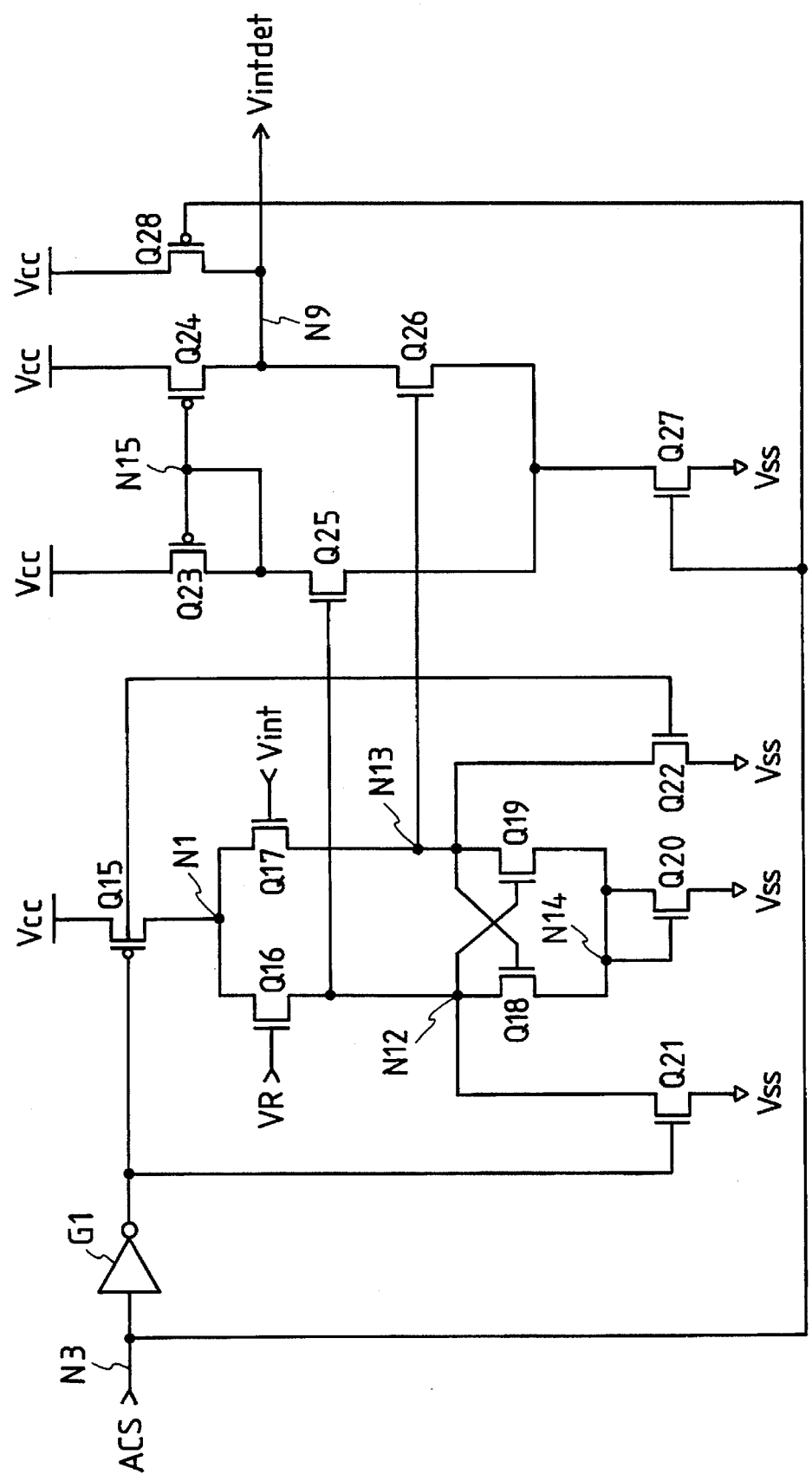
FIG. 3 is a detailed circuit diagram of an embodiment of an overshoot detector in FIG. 2.

Referring to FIG. 3, there is shown a detailed circuit diagram of an embodiment of the overshoot detector 16 in FIG. 2. As shown in this drawing, the overshoot detector 16 includes case-caded differential amplifiers for comparing the level of the downed voltage Vint at the node N4 with that of the reference voltage VR at the node N1.

In the standby mode in which the active control signal ACS is low in logic, a first load latched differential amplifier consisting of eight MOS transistors Q15–Q22 is turned off to generate a low logic signal to nodes N12 and N13. A second differential amplifier consisting of six MOS transistors Q23–Q28 is turned off to generate a precharged high logic signal as the overshoot detection pulse signal Vintdet.

On the contrary, in the active mode in which the active control signal ACS is high in logic, the two differential amplifiers are driven. In detail, the first differential amplifier consisting of the eight MOS transistors Q15–Q22 compares the level of the downed voltage Vint with that of the reference voltage VR. Then, the second differential amplifier consisting of the six MOS transistors Q23–Q28 amplifies an output signal from the first differential amplifier and outputs the amplified signal as the overshoot detection pulse signal Vintdet.

For example, if VR<Vint, the amount of current through the MOS transistor Q18 becomes larger than the amount of current through the MOS transistor Q19 because the amount of current through the MOS transistor Q17 becomes larger than the amount of current through the MOS transistor Q16. As a result, a high logic signal is generated at the node N13, whereas a low logic signal is generated at the node N12. Subsequently, the amount of current through the MOS transistor Q26 inputting the high logic signal at the node N13 becomes larger than the amount of current through the MOS transistor Q25 inputting the low logic signal at the node N12. In result, the overshoot detection pulse signal Vintdet at a node N9 is transited from its high logic to its low logic.

On the contrary, if VR>Vint, the amount of current through the MOS transistor Q16 becomes larger than the amount of the current through the MOS transistor Q17. As a result, a low logic signal is generated at the node N13, whereas a high logic signal is generated at the node N12. Subsequently, the amount of current through the MOS transistor Q25 inputting the high logic signal at the node N12 becomes larger than the amount of current through the MOS transistor Q26 inputting the low logic signal at the node N13. In result, the overshoot detection pulse signal Vintdet at the node N9 is transited from its low logic to its high logic.

Referring to FIG. 4, there is shown a detailed circuit diagram of an embodiment of the self-delay pulse generator 17 in FIG. 2. The self-delay pulse generator 17 inputs the overshoot detection pulse signal Vintdet, as shown in FIG. 5A, from the overshoot detector 16 in FIGS. 2 and 3 through the node N9 and generates the pulse signal of the desired pulse width, as shown in FIG. 5B, beginning with the falling edge of the inputted overshoot detection pulse signal Vintdet. To this end, the self-delay pulse generator 17 includes an inverter G2 for inverting the overshoot detection pulse signal Vintdet from the node N9, and a delay line 19 and a NAND gate G6 for commonly inputting the overshoot detection pulse signal inverted by the inverter G2.

The delay line 19 includes three inverters G3–G5 connected in series between the inverter G2 and the NAND gate G6 and a capacitor C1 connected between an output terminal of the inverter G3 and a second supply voltage source Vss. The delay line 19 delays the overshoot detection pulse signal inverted by the inverter G2 for a predetermined time period and inverts the delayed overshoot detection pulse signal again. The delayed and inverted overshoot detection pulse signal from the delay line 19 is supplied to the NAND gate G6. The delay time of the delay line 19 corresponds to the sum of propagation delay times of the three inverters G3–G5.

The NAND gate G6 NANDs the output signal from the inverter G2 and the output signal from the delay line 19 and outputs the resultant signal. The output signal from the NAND gate G6 has a low logic pulse width corresponding to the delay time of the delay line 19. Then, the output signal from the NAND gate G6 is applied to an inverter G7. The inverter G7 inverts the output signal from the NAND gate G6 to generate the pulse signal det as shown in FIG. 5B. The pulse signal det is then supplied to the current sink 18 in FIG. 2 through a node N10. The pulse signal det is transited from its low logic to its high logic at the moment that the level of the downed voltage Vint at the node N4 becomes larger than that of the reference voltage VR at the node N1 and then remains at its high logic for the delay time of the delay line 19.

Figure 6:
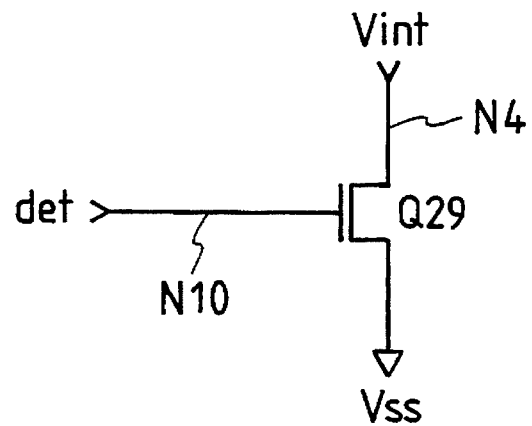
FIG. 6 is a detailed circuit diagram of an embodiment of a current sink in FIG. 2.

Referring to FIG. 6, there is shown a detailed circuit diagram of an embodiment of the current sink 18 in FIG. 2. As shown in this drawing, the current sink 18 includes an MOS transistor Q29 having a gate for inputting the pulse signal det from the self-delay pulse generator 17 in FIGS. 2 and 4 through the node N10. The MOS transistor Q29 is turned on for a high duration of the pulse signal det from the self-delay pulse generator 17 to mute the downed voltage Vint from the downed voltage driver 11 in FIG. 2 toward the second supply voltage source Vss through the node N4. As a result, the overshoot component generated in the downed voltage Vint is removed.

Figure 7:
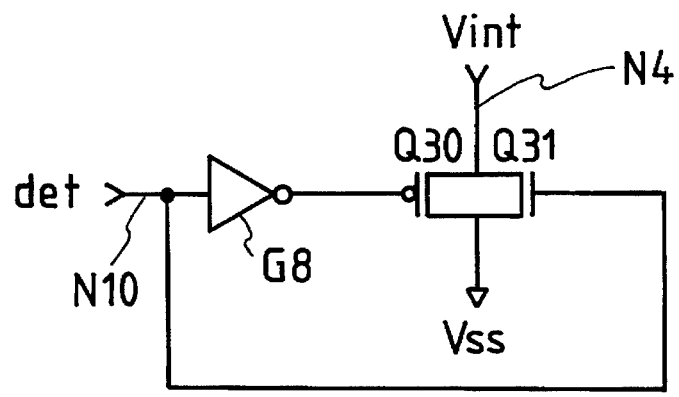
FIG. 7 is a detailed circuit diagram of an alternative embodiment of the current sink in FIG. 2.

Referring to FIG. 7, there is shown a detailed circuit diagram of an alternative embodiment of the current sink 18 in FIG. 2. As shown in this drawing, the current sink 18 includes an inverter G8 for inputting the pulse signal det from the self-delay pulse generator 17 in FIGS. 2 and 4 through the node N10 and an MOS transistor Q31 having a gate for inputting the pulse signal det from the self-delay pulse generator 17 through the node N10. The MOS transistor Q31 is turned on for the high duration of the pulse signal det from the self-delay pulse generator 17 to mute the downed voltage Vint from the downed voltage driver 11 in FIG. 2 toward the second supply voltage source Vss through the node N4.

The inverter G8 inverts the pulse signal det from the node N10 and outputs the inverted pulse signal to a gate of an MOS transistor Q30. Then, the MOS transistor Q30 is turned on for a low duration of the pulse signal inverted by the inverter G8 to mute the downed voltage Vint from the node N10 toward the second supply voltage source vss.

In result, the two MOS transistors Q30 and Q31 are adapted to mute the downed voltage Vint at the node N10 for the high duration of the pulse signal det at the node N10, so as to remove the overshoot component generated in the downed voltage Vint. Also, the two MOS transistors Q30 and Q31 minimize a current consumption amount in the muting operation.

As apparent from the above description, according to the present invention, the voltage down converter for the semiconductor memory device mutes temporarily the downed voltage being supplied to the memory blocks and the memory peripheral circuits upon the presence of the overload in the memory blocks and the memory peripheral circuits, so that the generation of the overshoot component in the downed voltage can be prevented. Therefore, the voltage down converter for the semiconductor memory device has the effect of protecting the memory blocks and the memory peripheral circuits from an overload and thus enhancing the reliability of the semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. In a semiconductor memory device having memory blocks for storing a plurality of binary information, memory peripheral circuits for controlling said memory blocks and reference voltage generation means for dividing a supply voltage from an external power supply circuit to drive said memory blocks and said memory peripheral circuits, a voltage down converter comprising:

downed voltage driving means for downing a reference voltage from said reference voltage generation means into different levels according to standby and active modes and supplying the downed voltage to said memory blocks and said memory peripheral circuits;

overshoot detection means for detecting whether a level of the downed voltage from said downed voltage driving means exceeds a desired voltage level; and voltage regulation means for regulating the level of the downed voltage from said downed voltage driving means being supplied to said memory blocks and said memory peripheral circuits in response to an output signal from said overshoot detection means to remove an overshoot component generated in the downed voltage from said downed voltage driving means.

2. A voltage down converter as set forth in claim 1, wherein said voltage regulation means includes:

a self-delay pulse generator for generating a pulse signal of a desired pulse width when the overshoot component is generated in the downed voltage from said downed voltage driving means; and a current sink for downing the level of the downed voltage from said downed voltage driving means being supplied to said memory blocks and said memory peripheral circuit for a time period of the pulse width of the pulse signal from said self-delay pulse generator.

* * * * *